United States Patent [19]

Numakura

[11] Patent Number: 5,286,609
[45] Date of Patent: Feb. 15, 1994

[54] PROCESS FOR THE FORMATION OF A NEGATIVE RESIST PATTERN FROM A COMPOSITION COMPRISING A DIAZOQUINONE COMPOUND AND AN IMIDAZOLE AND HAVING AS A HEAT STEP THE USE OF A HOT WATER CONTAINING SPRAY

[75] Inventor: Iwao Numakura, Tokyo, Japan

[73] Assignee: Yamatoya & Co., Ltd., Tokyo, Japan

[21] Appl. No.: 821,840

[22] Filed: Jan. 14, 1992

Related U.S. Application Data

[63] Continuation of Ser. No. 427,888, Oct. 30, 1989, abandoned.

[30] Foreign Application Priority Data

Nov. 1, 1988 [JP] Japan .................. 63-274559
Nov. 8, 1988 [JP] Japan .................. 63-280358
Dec. 30, 1988 [JP] Japan .................. 63-171432

[51] Int. Cl.$^5$ .................. G03F 7/32; G03F 7/38; G03F 7/023
[52] U.S. Cl. .................. 430/325; 430/165; 430/191; 430/192; 430/193; 430/328; 430/330
[58] Field of Search ............ 430/330, 325, 328, 192; 431/191, 193, 165

[56] References Cited

U.S. PATENT DOCUMENTS

| | | | |
|---|---|---|---|
| 4,104,070 | 8/1978 | Moritz et al. | 430/328 |
| 4,356,254 | 10/1982 | Takahashi et al. | 430/330 |
| 4,356,255 | 10/1982 | Tachikawa et al. | 430/325 |
| 4,431,725 | 2/1984 | Tachikawa et al. | 430/325 |
| 4,451,329 | 5/1984 | Batchelor et al. | 430/270 |
| 4,544,627 | 10/1985 | Takahashi et al. | 430/325 |
| 4,567,132 | 1/1986 | Fredericks et al. | 430/328 |
| 4,568,631 | 2/1986 | Badami et al. | 430/330 |
| 4,576,901 | 3/1986 | Stahlhofen et al. | 430/325 |
| 4,581,321 | 4/1986 | Stahlhofen | 430/330 |
| 4,696,891 | 10/1987 | Guzzi | 430/330 |
| 4,775,609 | 10/1988 | McFarland | 430/328 |
| 4,814,243 | 3/1989 | Ziger | 430/325 |
| 4,877,719 | 10/1989 | Higashi et al. | 430/330 |
| 4,927,741 | 5/1990 | Garth et al. | 430/330 |
| 4,963,617 | 10/1990 | Fourquier et al. | 524/808 |
| 5,002,858 | 3/1991 | Demmer et al. | 430/192 |

FOREIGN PATENT DOCUMENTS

| | | |
|---|---|---|
| 49-127615 | 12/1974 | Japan . |
| 50-108002 | 8/1975 | Japan . |
| 51-3633 | 1/1976 | Japan . |
| 52-6528 | 1/1977 | Japan . |
| 56-9740 | 1/1981 | Japan . |

*Primary Examiner*—Charles L. Bowers, Jr.
*Assistant Examiner*—John S. Chu
*Attorney, Agent, or Firm*—Wenderoth, Lind & Ponack

[57] ABSTRACT

A negative resist pattern is formed using a resist containing a diazoquinone sensitizer. An imagewise exposed area of a layer of the resist is subjected to heat treatment with a water-containing heating medium in the presence of a carboxyl-inactivating agent. The entire surface of the layer is exposed to radiation. The thus-exposed surface is then treated with an alkaline developer solution. An apparatus suitable for use in the practice of the above process is also disclosed.

15 Claims, 1 Drawing Sheet

PROCESS FOR THE FORMATION OF A NEGATIVE RESIST PATTERN FROM A COMPOSITION COMPRISING A DIAZOQUINONE COMPOUND AND AN IMIDAZOLE AND HAVING AS A HEAT STEP THE USE OF A HOT WATER CONTAINING SPRAY

This application is a continuation of now abandoned application, Ser. No. 07/427,888 filed on Oct. 30, 1989.

BACKGROUND OF THE INVENTION

1. Field of the Invention

The present invention relates to a process for the formation of a negative resist pattern and also to an apparatus suitable for use in the practice of the process. More specifically, the present invention is concerned with a process for forming a negative resist pattern with a resist containing a diazoquinone sensitizer and also with an image-reversal developing apparatus suitable for use in the practice of the process to perform both reversal of a positive image and development of the reversed, namely, negative image.

2. Description of the Related Art

As has been well-known, a variety of resists, are employed widely in the fabrication of semiconductor devices and the like to form desired patterns on substrates.

These resists include negative resists and positive resists. When imagewise exposed to radiation such as light, electron beams or x-rays, the exposed portion is insolubilized by a developer solution, namely, a solvent, whereby a negative image is provided. On the other hand, a positive resist becomes soluble in such a developer solution at an exposed portion so that a positive pattern is provided. Making use of their respective properties, these resists have found significant utility.

Many of these conventional resists are however used exclusively for the formation of either negative or positive resist patterns. Namely, it is impossible to selectively form either a negative pattern or a positive pattern by using the same resin commonly. Inconveniently, negative resists and positive resists must thus be selectively used depending on whether negative resist patterns are intended or positive resist patterns. Among these resists, positive resists are superior in resolution and the sharpness of printing areas to negative resists. There is hence an outstanding demand for the improvement of the resolution of negative resists.

On the other hand, resists capable of selectively forming either negative or positive patterns by changing treatment conditions in spite of the use of the same sensitizer (photosensitizer), namely, so-called image reversal resists have also been developed.

Among image reversal resists of the above sort, those using as a sensitizer an o-quinonediazide compound (diazoquinone compound; hereinafter called "diazoquinone sensitizer") are mentioned as typical examples.

The reversal of an image formed in a resist, which uses such a diazoquinone sensitizer, is considered to take place in accordance with the following mechanism.

A diazoquinone sensitizer has the characteristic property that upon exposure (first exposure) to radiation, diazo groups are decomposed and at the same time, carboxyl groups are formed. Accordingly, when a positive resist containing such a diazoquinone sensitizer (for example, a resist useful for imagewise exposure through a positive film to form a printing plate bearing a positive pattern) is exposed imagewise to radiation through a positive film by a method known per se in the art, carboxyl groups are formed in the exposed area (i.e., the area corresponding to the image-free area of the positive film), whereby upon treatment with an alkaline developer solution, the exposed area is removed to allow the unexposed area to remain as a pattern, thereby obtaining a positive image.

To obtain a negative image on the other hand, it is necessary to make the resultant carboxyl groups inactive or inert to an alkaline developer solution. To make the area, which is other than that subjected to the first exposure, soluble in an alkali developer solution, after inactivation of the carboxyl groups, full-face exposure (second exposure) is performed, followed by development with an alkaline developer solution. As a result, an image reversed from the aforementioned image, i.e., a negative image is obtained.

A variety of processes has been proposed for the inactivation of carboxyl groups formed by first exposure in a resist which contains a diazoquinone sensitizer, for example, including the process in which a second component capable of promoting decarboxylation of carboxyl groups is added in combination with a diazoquinone sensitizer and heat treatment is applied subsequent to first exposure. Specifically described, it has been proposed to use triethanolamine (see Japanese Patent Application Laid-open No. 127615/1974), a second or tertiary amine (see Japanese Patent Application Laid-Open No. 108002/1975), a 1-hydroxyethyl-2-alkylimidazoline (see Japanese Patent Application Laid-Open No. 6528/1977), a quinone compound or aromatic ketone compound (see Japanese Patent Application Laid-Open No. 127615/1974), a basic carbonium dye (see Japanese Patent Application Laid-Open No. 9740/1981), etc. These conventional reversal processes however require subsequent to first exposure, that a heat treatment be conducted in air, for example, in a constant-temperature air oven maintained around 150° C. for a relatively long period of time, say, 10 minutes or even longer. This constitutes a serious obstacle for practice of these processes. Further, heating in such a constant-temperature air oven locally results in uneven heating. These conventional processes are therefore accompanied by another serious drawback that they cannot provide any pattern of desired quality where the intended pattern is a fine pattern.

A still further process has also been proposed, in which a resist subjected to first exposure is treated with an acidic aqueous solution such as HCl or $H_2SO_4$ to decarboxylate carboxyl groups formed by the first exposure (Japanese Patent Application Laid-open No. 3633/1976). This process however requires treatment conditions of a time period as long as 4-5 minutes at a temperature of about 90° C. and involves inevitable corrosion of a treatment apparatus. This process is therefore impractical too.

SUMMARY OF THE INVENTION

The present inventors have carried out an extensive investigation with a view toward solving the above-described drawbacks of the conventional processes. As a result, it has been found that in a process for forming a resist pattern with a diazoquinone sensitizer capable of forming both positive and negative resist patterns, the technical feature of applying hot-water treatment for an extremely short period of time makes it possible to render carboxyl groups, which are formed in the sensitizer upon first exposure, inactive or inert to an alkaline developer solution to be used in the next step, to promote carboxylation in the unexposed area, to accelerate the treatment with the alkaline developer solution in the next step and further to obtain an reversed pattern of excellent resolution. It has also been found that in association with the hot-water treatment, use of a water-insoluble or sparingly water-soluble imidazole compound as a second component capable of directly or catalytically reacting with photochemical reaction products derived from the diazoquinone sensitizer by the first exposure can afford a pattern of extremely good resolution.

An object of this invention is therefore to provide, based on these findings, a novel process for forming a reversed, especially, negative resist pattern with a resist which uses a diazoquinone sensitizer of the image reversal type.

Another object of this invention is to provide an image-reversal developing apparatus suitable for use in the practice of the above process.

In one aspect of this invention, there is thus provided a process for forming a negative resist pattern with a resist containing a diazoquinone sensitizer, which comprises subjecting an imagewise exposed area of a layer of the resist to heat treatment with a water-containing heating medium in the presence of a carboxyl-inactivating agent, exposing the entire surface of the layer to radiation, and then treating the thus-exposed surface with an alkaline developer solution.

In another aspect of this invention, there is also provided an image-reversal developing apparatus for forming a negative resist pattern from a presensitized and imagewise-exposed plate carrying thereon a sensitized resist layer containing a diazoquinone sensitizer, comprising:

(i) a means for conveying the plate through the apparatus from an inlet to an outlet;

(ii) a means for treating with a water-containing heating medium the plate transferred by the conveyor means;

(iii) a means for eliminating the water-containing heating medium still remaining on the plate;

(iv) a means for subjecting the plate to full-face exposure; and (v) a means for developing the plate with an alkaline developer solution; and said treatment means (ii), elimination means (iii), full-face exposure means (iv) and developing means (v) being arranged successively along the conveyor means (i) from a side of the inlet toward a side of the outlet.

The heat treatment by the water-containing heating medium, said treatment being applied for the reversal of the pattern subsequent to the first exposure, has significantly improved the drawbacks of the conventional reversal processes. Namely, the conventional heat treatment required to obtain a negative resist pattern is conducted in air. To achieve sufficient reversal effects, it requires not only a temperature as high as around 150° C. but also a treatment time as long as 10 minutes or even longer. Heat treatment at such a high temperature for such a long time is however not practical. There has hence been a strong demand for further lowering of the treatment temperature and further shortening of the treatment time. The heat treatment of this invention, which makes use of a water-containing heating medium, permits heating under air free conditions. This has made it possible to complete the reversal at a lower temperature in a shorter time period.

Further, according to the heat treatment of this invention which makes use of a water-containing heating medium, the unexposed area (the area not exposed to radiation upon the first exposure) is brought into contact with the water-containing heating medium, for example, warm water. This has led to the merit that the treatment with an alkaline developer solution in the next step can be accelerated, in other words, the productivity can be increased. This may probably be attributed to the conversion of a portion of the sensitizer in the unexposed area into the corresponding carboxylic acid under the influence of water and heat. The above effects are not available when the heat treatment is conducted using a water-free liquid, for example, paraffin alone. The use of water is therefore essential in the present invention.

In addition, the heat treatment with the water-containing heating medium can realize a uniform heat treatment temperature, in other words, it can avoid uneven temperatures, thereby making it possible to obtain a negative resist pattern having excellent resolution. The heat treatment in air involves the drawback that a negative resist pattern partially flows out upon development in an alkaline developer solution. The heat treatment of this invention does not have this problem.

Since the present invention has made it possible to form both positive patterns and negative patterns by using the same type of resists, the same type of developer solution and the same type of apparatus, commonly. Unlike the conventional techniques, it is no longer needed to choose the type of resist depending on whether an original is positive or negative.

Reversed, namely, negative resist patterns formed on substrates (for example, presensitized plates) in accordance with the present invention are subjected, for example, to etching, resist removal and washing in a similar manner to the conventional processes and are then used for the fabrication of semiconductor devices and the like.

DETAILED DESCRIPTION OF THE INVENTION

Figure 1:
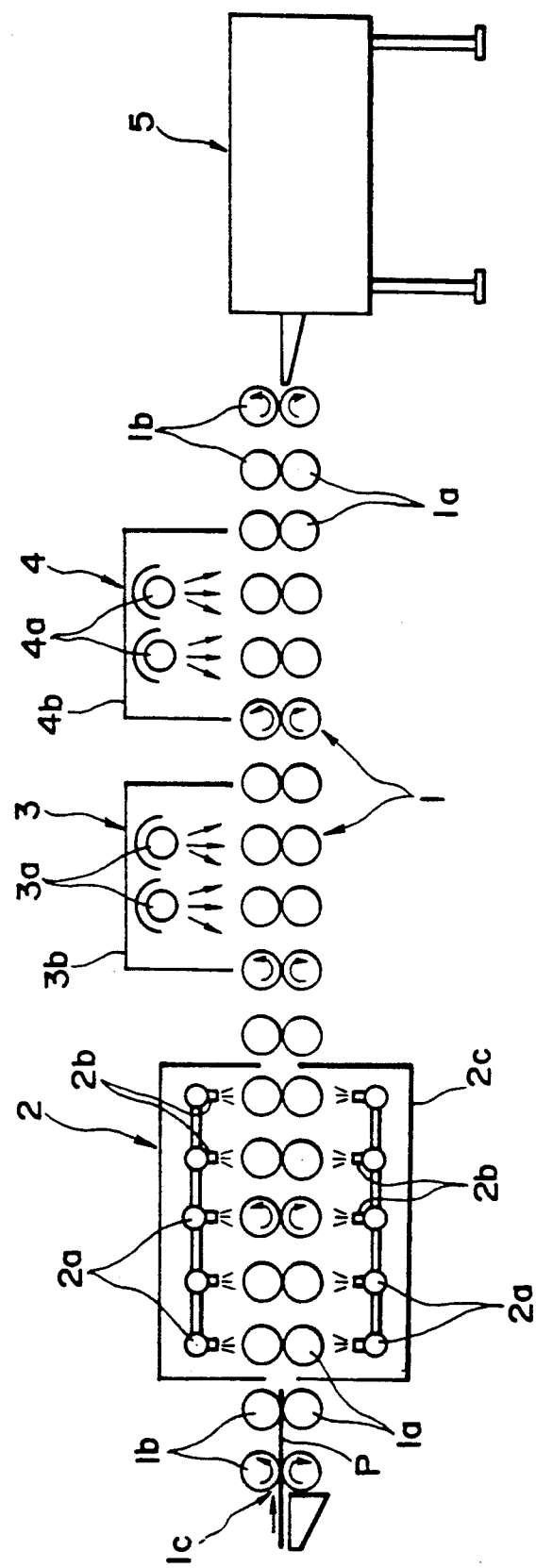
FIG. 1 is a simplified schematic illustration of an image-reversal developing apparatus useful in the practice of the process of this invention for the formation of a reversed, namely, negative resist pattern.

As a sensitizer for making up a resin useful in the practice of this invention, one of o-quinonediazide compounds, namely, diazoquinone sensitizers commonly known as positive sensitizers. Typical examples of this sort include hydroxybenzophenone, novolak resins, and o-benzo- and o-naphthoquinonediazide sulfonate esters.

Representative and more specific examples of the o-quinonediazide compounds referred to above include 2,2'-dihyroxydiphenyl-bis(naphthoquinone-1,2-diazido-5-sulfonate) esters, 2,2',4,4'-tetrahydroxydiphenyl-tetra(naphthoquinone-1,2-diazido-5-sulfonate) esters, 2,3,4-trioxybenzophenone-bis(naphthoquinone-1,2-diazido-5-sulfonate) esters. In addition to these naphthoquinone-1,2-diazido-5-sulfonate esters, 4-sulfonate esters can also be used either singly or in combination with the 5-sulfonate esters.

To reverse a resist, which contains a diazoquinone sensitizer as a positive sensitizer, into a negative resist after subjecting the first-mentioned resist to first exposure, one or more of various second component compounds are used in combination with the diazoquinone sensitizer in this invention as described above. Usable as second component compounds of this sort are various amines, 1-hydroxy-2-alkylimidazolines, quinone compounds, aromatic ketone compounds, basic carbonium dyes, imidazoline compounds, and imidazole compounds (for example, $C_6H_{10}N_2$, 2-ethyl-4-methylimidazole) as described above.

For the efficient reversal of a resist, which contains one or more of the diazoquinone sensitizers described above, into a negative resist after subjecting the first-mentioned resist to first exposure in this invention, it is particularly preferred to use one or more of water-insoluble or sparingly water-soluble imidazole compounds in view of the heat treatment with a water-containing heating medium, for example, hot water to be applied upon formation of a negative pattern.

The above-described imidazole compounds useful in the practice of this invention are represented by the following formula:

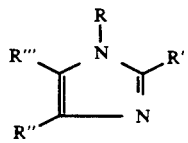

wherein R, R', R" and R''' are independently a hydrogen atom or a substituted or unsubstituted alkyl, aryl or aralkyl group.

Specific examples of the imidazole compounds include 2-phenyl-4-methylimidazole, 2-phenylimidazole, 1-benzyl-2-methylimidazole, 2-undecylimidazole, 2pentadecylimidazole, etc. They may be used either singly or in combination.

As a binder or base resin making up the resist useful in the practice of this invention, one or more of resins available as resist resins on the market can be used. Illustrative of the base or binder resin include phenol-formaldehyde resins, novolak cresol-formaldehyde resins, styrene-maleic anhydride copolymers, methacrylic acid-methyl methacrylate copolymers, and the like. Although not intended to be limited, commercially-available resist resins include "AZ1350", "AZ1370", "AZ1350J", "AS1375" and "AZ111 " (all, trade names; products of Spray Company); a series of "OFPR" (all, trade name; products of Tokyo Ohka Kogyo Co., Ltd.); "Waycoat LSI Posi Resist" (trade name; product of Hant Chemical Inc.).

The mixing of the sensitizer (diazoquinone sensitizers) and the second component compound with the resist resin (binder) can be practiced in a manner known p&r se in the art, for example, by thoroughly stirring them into an intimate mixture with a stirrer or the like. Incidentally, it is also possible to use the second component compound in a form incorporated in the water-containing heating medium upon conducting the heat treatment for reversal. In this case, the second component compound is not mixed in the resist resin in general.

Although no particular limitation is imposed on the amounts of the above additives (i.e., the sensitizer and second component) to be added to the resist resin, they may each be added, generally, in an amount of at least 1 part by weight, preferably 1-20 parts by weight, notably 5-15 parts by weight per 100 parts by weight of the resist resin. If the amount of each of the additives is smaller than 1 part by weight, there is a tendency that the intended effects may not be exhibited fully. Such a small amount is therefore not preferred. In contrast, any amounts in excess of 20 parts by weight may impair the sensitivity of the resist and are hence not preferred either.

In addition to the above additives, various other additives can also be incorporated in the present invention. For example, imaging materials (a variety of dyes) can be added to enhance the contrast between an exposed area and an unexposed area so that the detection of non-conforming products may be facilitated.

A description will next be made of a process of this invention for forming a resist pattern on one of various substrates such as Si, $SiO_2$ and Al substrates by using a resist which contains the above-described diazoquinone sensitizer capable of forming both positive and negative resist patterns.

First of all, a substrate which has been subjected in advance to washing pretreatment by a usual method is coated uniformly with the resist useful in the practice of this invention by spinning, spraying, roll-coating, dipping or the like. The thus-coated film is then prebaked, for example, in an infrared, closed-loop hot-air or convection-type oven, thereby completely eliminating the solvent from the coating film. Although prebaking conditions vary depending on the kinds of the solvent and resist resin employed, the prebaking is generally conducted for about 5-30 minutes at 50°-110° C.

(i) Formation of Positive Pattern

After the prebaking, the coating film is exposed to radiation through a reticle or mask which bears a desired pattern. When a positive image is desired, it is only necessary to develop the thus-exposed coating film with a conventional alkaline developer solution.

Exemplary alkaline developer solutions include solutions of caustic soda, caustic potassium, sodium silicate, potassium silicate, tribasic sodium phosphate, tribasic potassium phosphate, sodium carbonate, potassium carbonate and the like. It is also possible to use alkaline developer solutions of organic bases such as tetraalkylammonium hydroxides (e.g., tetramethylaluminum hydroxide) and trimethyl(2-hydroxyethyl)ammonium hydroxide (choline).

When treated with the above-described alkaline developer solution, the exposed and solubilized area is dissolved in the developer solution and the unexposed portion of the coating film remains on the substrate. As in conventional processes, the remaining positive coating film is then subjected to post-baking under heat treatment conditions which are determined depending on the kind of the resist resin employed, whereby the adhesion between the substrate and the resist film can be enhanced to form a positive resist pattern on the substrate.

Formation of Negative Pattern

When it is desired to form a negative pattern on a substrate on the other hand, first exposure is conducted through a leticle or mask of a desired pattern. Either concurrently with or subsequently with the first exposure, heat treatment is conducted with hot water or a water-containing hot liquid. Thereafter, the entire surface of the coating film is exposed (second exposure), followed by development in an alkaline developer solution employed widely to date. By this development, the unexposed area of the coating film of the resist has been solubilized so that the unexposed area is dissolved in the developer solution. As a result, the area of the coating film of the resist, said area having been subjected to the first exposure step, remains on the substrate, so that a negative resist pattern of high resolution can be obtained.

In the process of this invention for the formation of a resist pattern, especially, a negative resist pattern, the greatest feature resides in the heat treatment by a water-containing heating medium such as hot water or a water-containing liquid, which is performed subsequent to the first exposure as described above.

The heat treatment is conducted for 5–180 seconds at 30°–100° C., preferably for 5–60 seconds, notably 5–30 seconds at 50°–95° C. For example, the heat treatment can be completed in 4–5 seconds using hot water of 85° C. The heat treatment can be carried out, for example, by immersing the resist-bearing substrate, which has been subjected to first exposure, in hot water or the like or by spraying hot water or the like onto the resist-bearing substrate.

The heat treatment can also be conducted using hot steam. Use of hot steam is suitable for a continuous operation because the heat treatment can be carried out in a short time, for example, at a temperature in the neighborhood of 100° C.

As liquids which may be used in combination with water, those not etching or otherwise adversely affecting on the resist resin are preferred. For example, paraffin can be used.

An apparatus suitable for use in the practice of the process of this invention for the formation of an reversed, namely, negative resist pattern will next be described with reference to the accompanying sole drawing.

As has been mentioned above, the present invention has made it possible to reverse an undeveloped, i.e., latent positive pattern, which has been formed in a presensitized plate having a layer of a resist containing a diazoquinone sensitizer of the image reversal type, into a positive pattern.

At a working site of a photomechanical process, it is generally necessary to install at least two types of presensitized plates, one for positive patterns and the other for negative patterns. This also applies equally to developing machines. This requirement leads to problems in the initial cost and installation space and also to the problem of cumbersomeness in operation that either one of these two types of presensitized plates have to be chosen depending on the type of each pattern.

The provision of an apparatus suitable for use in the practice of the process of this invention for the formation of a negative pattern makes it possible to use a single type of developer solution and a single type of presensitized plates for the formation of both positive and negative patterns irrespective of the type of an original pattern through which the presensitized plate is exposed to radiation and moreover to solve the problems described above.

One example of the apparatus suitable for use in the formation of a negative pattern in accordance with the process of this invention is illustrated in FIG. 1. It should however be borne in mind that this invention is not necessarily limited to or by the illustrated apparatus.

Numeral 1 indicates a conveyor means for a presensitized positive plate P. The presensitized plate P is conveyed rightwards as viewed in the figure while being successively held between a number of carrier rollers 1a,1b disposed in pairs in a face-to-face relationship.

Designated at numeral 2 is a means for spraying hot water onto the presensitized plate P. Through many nozzles 2b attached to a feed line 2a which is in turn connected to an unillustrated hot water source, hot water is sprayed onto the presensitized plate P which the presensitized plate P is conveyed by the carrier rollers 1a,1b.

An enclosure indicated at numeral 2c is provided to prevent splashing of hot water released through the nozzles 2b.

A dryer means is indicated at numeral 3, which is equipped with lamps 3a as heat sources. Hot water sprayed by the hot water spraying means 2 and still remaining on the presensitized plate P is removed while the presensitized plate P travels through the dryer means.

Another enclosure designated at numeral 3b is provided to prevent release of heat given off from the heat source lamps 3a.

Designated at numeral 4 is an exposure means for the presensitized plate P. When the presensitized plate P which has travelled through the dryer means 3 reaches the exposure means 4, the presensitized plate P is exposed to light irradiated from exposure lamps 4a.

A further enclosure indicated at numeral 4b is provided to prevent release of light irradiated from the exposure lamps 4a.

Numeral 5 indicates an ordinary developing machine. Although not illustrated in the drawing, the developing machine is equipped with mechanisms required for development.

When it is desired to use the presensitized positive plate P a negative plate, the presensitized positive plate P bearing a latent positive pattern is loaded at a plate inlet 1c. The presensitized plate P is then conveyed to the hot water spray means 2.

Here, hot water is sprayed onto the positive patio tern bearing surface of the presensitized positive plate, so that the solubility of the positive pattern in an alkaline solution is lost.

The presensitized plate which has been imparted with the above-described property for the pattern by the hot water spray means (2) is conveyed to the dryer means, where any remaining hot water is removed by the dryer means 3, followed by further travelling to the exposure means 4. Incidentally, any hot water still remaining on the presensitized plate P may be simply wiped away in this invention instead of drying it up by the dryer means 3.

The pattern-bearing surface of the presensitized plate P is next subjected to full-face exposure, whereby the unexposed area is rendered soluble in an alkaline solution.

The presensitized plate P is next fed into the developing machine 5 by the conveyor means 1, so that the unexposed area rendered soluble to the alkaline solution is removed. Namely, prescribed developing treatment is applied.

When it is desired to use the presensitized plate as a positive plate, it is only necessary to feed the presensitized plate directly into the developer 5 without feeding same through the spay means 2 to exposure means 4. Prescribed development is then carried out by the developing machine 5.

Namely, the positive pattern formed in the presensitized plate P is converted to have the same functions as the an ordinary negative film, so that the presensitized plate P can be developed without any problem by the developing machine 5 which uses a developer solution for positive patterns.

The present invention will hereinafter be described in further detail by the following examples. It should however be borne in mind that this invention will not be limited to or by the following examples.

EXAMPLE 1

Five parts by weight of methylethylimidazoline were mixed with 100 parts by weight of "AZ1350" (trade name for a positive photoresist produced by Spray Company). A glass substrate for mask, which had a vacuum-evaporated chromium coating, was coated with the above-prepared coating formulation at 3,000 rpm on a spinner.

The thus-applied resist coating film was then prebaked at about 95° C. for approximately 5 minutes. To form a pattern in the coating film, the prebaked coating film was subjected to first imagewise exposure for 60 seconds under 250 W high-pressure mercury vapor lamps, followed by treatment with hot water of about 95° C. for 15 seconds. By this heat treatment, the exposed area was rendered insoluble in alkaline developer solutions. The film thus heat-treated was then subjected to full-face exposure (second exposure) for about 30 seconds under 250 W high-pressure mercury vapor lamps.

The resulting exposed resist film was developed for 1 minute using an alkaline developer solution which contained as principal components sodium silicate and sodium phosphate. The area not subjected to the first exposure was dissolved in the developer solution, thereby providing a negative resist pattern. The resolution of the thus-obtained negative resist pattern was 1 $\mu$m, so that the resolution was substantially improved compared to conventional negative resist patterns.

COMPARATIVE EXAMPLE 1

The procedure of Example 1 was followed in exactly the same manner except that the heat treatment after the first exposure was conducted for 3 minutes in air of 95° C. The area subjected to the first exposure was not completely reversed into a negative pattern by the reversal treatment, so that the resultant pattern flowed out over the entire area thereof upon development. No good pattern was hence obtained.

EXAMPLE 2

The procedure of Example 1 was followed in exactly the same manner except that a commercial presensitized plate of the positive type using a diazoquinone sensitizer (product of Frendlefer Company) was used and the heat treatment after the first exposure was conducted for 10 seconds at about 75° C. A perfect negative resist pattern was obtained.

COMPARATIVE EXAMPLE 2

The procedure of Example 2 was followed in exactly the same manner except that the heat treatment after the first exposure was conducted for 3 minutes in air of 95° C. The area subjected to the first exposure was not completely reversed into a negative pattern by the reversal treatment, so that the resultant pattern flowed out over the entire area thereof upon development. No good pattern was hence obtained.

EXAMPLE 3

"FPS" (trade name for a presensitized plate of the positive type using a diazoquinone sensitizer and produced by Fuji Photo Film CO., Ltd.) was subjected to first imagewise exposure for 60 seconds under 250 W high-pressure mercury vapor lamps. Next, 0.2 g of methylethylimidazoline was dissolved in 1 l of hot water whose temperature was 85° C. The presensitized plate which had been subjected to the first exposure was immersed for 1 minute in the aqueous solution. The plate was washed with water, dried, subjected to full-face exposure in a similar manner to Example 1, and then developed. As a result, the area not subjected to the first exposure was dissolved completely, thereby providing a negative pattern of excellent resolution.

EXAMPLE 4

In 100 parts by weight of methylcellosolve, were dissolved 1 part by weight of 2-phenyl-4-methylimidazole, 4 parts by weight of an o-naphthoquinonediazide/phenol novolak ester, 1 part by weight of phenol novolak and 0.2 part by weight of oil blue. A silicate-treated aluminum plate was spin-coated with the thus-prepared coating formulation on a wheeler to give a dry film thickness of 1 $\mu$m, followed by drying.

In the above manner, two coated aluminum plates were prepared. Each of these coated aluminum plates was subjected to imagewise exposure (first exposure) at 100 mj/cm$^2$. One of the aluminum plates was then developed in a developer solution which contained sodium silicate as principal component. As a result, a perfect positive pattern was obtained.

On the other hand,,the other aluminum plate was immersed in hot water of 95° C. for 15 seconds after the first exposure. By this step, the pattern was reversed into a negative pattern. It was thereafter subjected to full-face exposure at 100 mj/cm$^2$. Similarly to the above procedure, the aluminum plate was developed for 1 minute in a developer solution which contained sodium silicate as a principal component. As a result, a perfect positive pattern was obtained.

EXAMPLE 5

The procedure of Example 4 was followed in exactly the same manner except for the use of 2-phenylimidazole instead of 2-phenyl-4-methylimidazole. Perfect positive and negative resist patterns were obtained.

EXAMPLE 6

The procedure of Example 4 was followed in exactly the same manner except for the use of 1-benzyl-2-methylimidazole in place of 2-phenyl-4-methylimidazole. Perfect positive and negative resist patterns were obtained.

EXAMPLE 7

The procedure of Example 4 was followed in exactly the same manner except for the use of an acidic aqueous solution, whose pH had been adjusted to 1.0 (pH 1.0) by the addition of p-sulfonic acid, in the heat treatment. A perfect negative resist pattern was obtained.

COMPARATIVE EXAMPLE 3

A presensitized plate was prepared in a similar manner to Example 4 except for the use of a sensitizer free of imidazole, namely, a conventional positive sensitizer for presensitized plates. The plate was treated in a similar manner to Example 7. It was however unable to obtain superior properties in resolution and ink applicability to those available from presensitized plates obtained using the imidazole-containing sensitizer.

EXAMPLE 8

The procedure of Example 4 was followed in a similar manner except for the addition of 0.5 part of 4,4'-methylenebis(2-chloroaniline) as an additive besides 1 part by weight of 2-phenyl-4-methylimidazole. As a result, a perfect negative pattern of excellent resolution was obtained.

COMPARATIVE EXAMPLE 4

The procedure of Example 4 was followed in a similar manner except for the use of 4,4'-methylenebis(2-chloroaniline) in lieu of 2-phenyl-4-methylimidazole. It was however unable to obtain superior properties in resolution and ink applicability to those available from the use of the imidazole-containing sensitizer.

EXAMPLE 9

(i) Preparation of Sensitizer o-Naphthoquinonediazido-4-sulfonyl chloride and a cresol novolak resin ("Ready Top PSF-2807", trade name; product of Gun-ei Chemical Industry Co., Ltd.) were reacted at 1:1 by weight to obtain a sensitizer-binder mixture as a yellow powder.

(ii) Preparation of Sensitizer Formulation

A 1 kg batch was prepared by adding methylcellosolve to 70 g of the mixture prepared in the above procedure (i), 3.5 g of imidazole and 0.3 g of oil blue. The batch was stirred at temperatures below 45° C. to dissolve the solid components. The resultant mixture was filtered through a 0.5-μm filter to obtain a sensitizer formulation.

(iii)

Sand-blasted and anodized aluminum plates were separately spin-coated with the sensitizer formulation, which had been prepared in the above procedure (ii), at 80 rpm on a wheeler, followed by drying for 5 minutes in a hot-air dryer of 100° C.

(iv)

The aluminum plates (iii) were divided into two groups, namely, Group A and Group B. The aluminum plates in both the groups were subjected to imagewise exposure at 100 mj/cm$^2$ under ultraviolet lamps. The aluminum plates in Group A were directly developed at room temperature in a developer solution which was a 1% aqueous solution of sodium silicate. Sharp positive resist patterns were obtained in about 30 seconds.

Some of the imagewise exposed aluminum plates in Group B were immersed for about 5 seconds in hot water of 95° C. Water droplets on their surfaces were gently wiped away with a cloth, and they were then subjected to full-face exposure at 100 mj/cm$^2$ in a similar manner to the imagewise exposure. The aluminum plates were then developed at room temperature in the same developer solution as that employed for the aluminum plates in Group A. Sharp negative resist patterns were obtained in about 30 seconds.

Further, the remaining aluminum plates in Group B were divided further into two groups. They were treated for about 15 seconds with hot water of 80° C. and for about 100 seconds with warm water of 60° C., respectively. The thus-treated aluminum plates were subjected to similar full-face exposure and development. Each of the aluminum plates gave a sharp negative resist pattern.

I claim:

1. A process for forming a negative resist pattern with a resist containing a diazoquinone sensitizer, which comprises the steps of
   subjecting an imagewise exposed area of a layer of the resist to heat treatment with a water-containing heating medium in the presence of an imidazole compound, the heat treatment with a water-containing heating medium being conducted by exposure of the resist layer to a water-containing hot liquid in the form of spray at 50°–95° C. for 5–29 seconds,
   exposing the entire surface of the heat-treatment layer to radiation, and
   then treating the thus-exposed surface with an alkaline developer solution to remove non-image areas to give a negative pattern.

2. A process for forming a negative resist pattern with a resist containing a diazoquinone sensitizer, which comprises the steps of
   subjecting an imagewise exposed area of a layer of the resist to heat treatment with a water-containing heating medium in the presence of an imidazole compound, the heat treatment with a water-containing heating medium being conducted by exposure of the resist layer to a water-containing hot liquid in the form of spray at 50°–79° C. for 5–60 seconds,
   exposing the entire surface of the heat-treatment layer to radiation, and
   then treating the thus-exposed surface with an alkaline developer solution to remove non-image areas to give a negative pattern.

3. The process of claim 1 or 2, wherein the imidazole compound is contained in the resist.

4. The process of claim 1 or 2, wherein the imidazole compound is contained in the water-containing heating medium.

5. The process of claim 1 or 2, wherein the imidazole compound is an imidazole compound represented by the following formula:

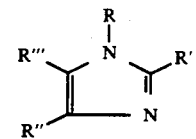

wherein R, R', R" and R'" are independently a hydrogen atom or a substituted or unsubstituted alkyl, aryl or aralkyl group.

6. The process of claim 5, wherein the imidazole compound is water-soluble or sparingly water-soluble.

7. The process of claim 5, wherein the imidazole compound is selected from the group consisting of 2-phenyl- 4-methylimidazole, 2-phenylimidazole, 1-benzyl-2-methylimidazole, 2-undecylimidazole, 2-pentadecylimidazole, and mixtures thereof.

8. The process of claim 1 or 2, wherein the diazoquinone sensitizer is selected from the group consisting of 2,2'-dihyroxydiphenyl-bis(naphthoquinone-1,2-diazido-5-sulfonate) esters, 2,2',4,4'-tetrahydroxy-diphenyl-tetra(naphthoquinone-1,2-diazido-5-sulfonates) esters, 2,3,4-trioxybenzophenone-bis(naphthoquinone-1,2- diazido-5-sulfonate) esters, 2,2'-dihyroxydiphenyl-bis(naphthoquinone-1,2-diazido-4-sulfonate) esters, 2,2',4,4'-tetrahydroxydiphenyl-tetra(naphthoquinone-1,2-diazido-4-sulfonates) esters, 2,3,4-trioxybenzophenone-bis(naphthoquinone-1,2-diazido-4-sulfonate) esters, and mixtures thereof.

9. The process of claim 1 or 2 wherein the resist comprises a base resin selected from the group consisting of phenol-formaldehyde resins, novolak cresol-formaldehyde resins, styrene-maleic anhydride copolymers, methacrylic acid-methyl methacrylate copolymers, and mixtures thereof.

10. The process of claim 9, wherein the resist contains 1–20 parts by weight of the diazoquinone sensitizer per 100 parts by weight of the base resin.

11. The process of claim 9, wherein the resist contains 1–20 parts by weight of the carboxyl-inactivating agent.

12. The process of claim 1 or 2 wherein the water-containing medium is hot water.

13. The process of claim 1 or 2 wherein the water-containing heating medium is water-containing paraffin.

14. The process of claim 1 or 2 wherein carboxyl-inactivating agent is selected from the group consisting of methylethylimidazoline, 2-phenyl-4-methylimidazole, 2-phenylimidazole, 1-benzyl-2-methylimidazole, 4,4'-methylenebis(2-chloroaniline).

15. The process of claim 1 or 2, wherein the diazoquinone sensitizer is selected from the group consisting of o-naphthoquinonediazide and o-naphthoquinonediazido-4-sulfonyl chloride.

* * * * *